United States Patent [19]

Hartman

[11] 4,017,743
[45] Apr. 12, 1977

[54] ELIMINATION OF CROSSTALK IN TWO SEQUENTIALLY OPERATED DARLINGTON AMPLIFIER CHANNELS

[75] Inventor: Clyde E. Hartman, Huntsville, Ala.

[73] Assignee: The United States of America as represented by the Secretary of the Army, Washington, D.C.

[22] Filed: Sept. 26, 1975

[21] Appl. No.: 617,213

[52] U.S. Cl. .............................. 307/237; 307/242; 328/71; 328/104; 328/154
[51] Int. Cl.² ................. H03K 17/16; H03K 17/56
[58] Field of Search ................... 307/237, 241–244; 330/124 D; 179/15 AN; 328/103, 104, 152, 154, 163, 71

[56] References Cited

UNITED STATES PATENTS

| | | | |
|---|---|---|---|
| 3,175,050 | 3/1965 | Oxman | 307/242 X |
| 3,248,567 | 4/1966 | Quinlan | 307/243 X |
| 3,504,195 | 3/1970 | Kimball et al. | 307/243 |
| 3,550,016 | 12/1970 | Gugliotti | 307/243 X |

Primary Examiner—John Zazworsky
Attorney, Agent, or Firm—Nathan Edelberg; Robert P. Gibson; Robert C. Sims

[57] ABSTRACT

Discrete logic circuit crosstalk in two sequentially-split pulse Darlington amplifier channels is eliminated by the use of diodes connected between the stages of the amplifiers so as to clamp the non-operating amplifier to ground condition. Also transistors may connect the non-operating amplifier to ground conditions so as to eliminate any unwanted pulses.

4 Claims, 3 Drawing Figures

ELIMINATION OF CROSSTALK IN TWO SEQUENTIALLY OPERATED DARLINGTON AMPLIFIER CHANNELS

DEDICATORY CLAUSE

The invention described herein may be manufactured, used, and licensed by or for the Government for governmental purposes without the payment to me of any royalties thereon.

BACKGROUND OF THE INVENTION

A customized hermetically sealed integrated circuit can (HIC can) which is a layout of four IC chips on a substrate packaged in a round 16 lead can, have experienced failures in an operational system. Test showed an average power thermal problem to be the cause of the failure. Excessive heat was found to be caused by crosstalk pulses of current in the final stages of the Darlington amplifier channels. A circuit similar to that used in the HIC can was built and test revealed that it too experienced crosstalk between the two time sequenced channels. Therefore a need exists for the elimination of this crosstalk and is provided by this invention.

DESCRIPTION OF THE PREFERRED EMBODIMENTS

Circuit operation will be described by reference to the drawings.

Conditions Before Application of Invention

Figure 1:
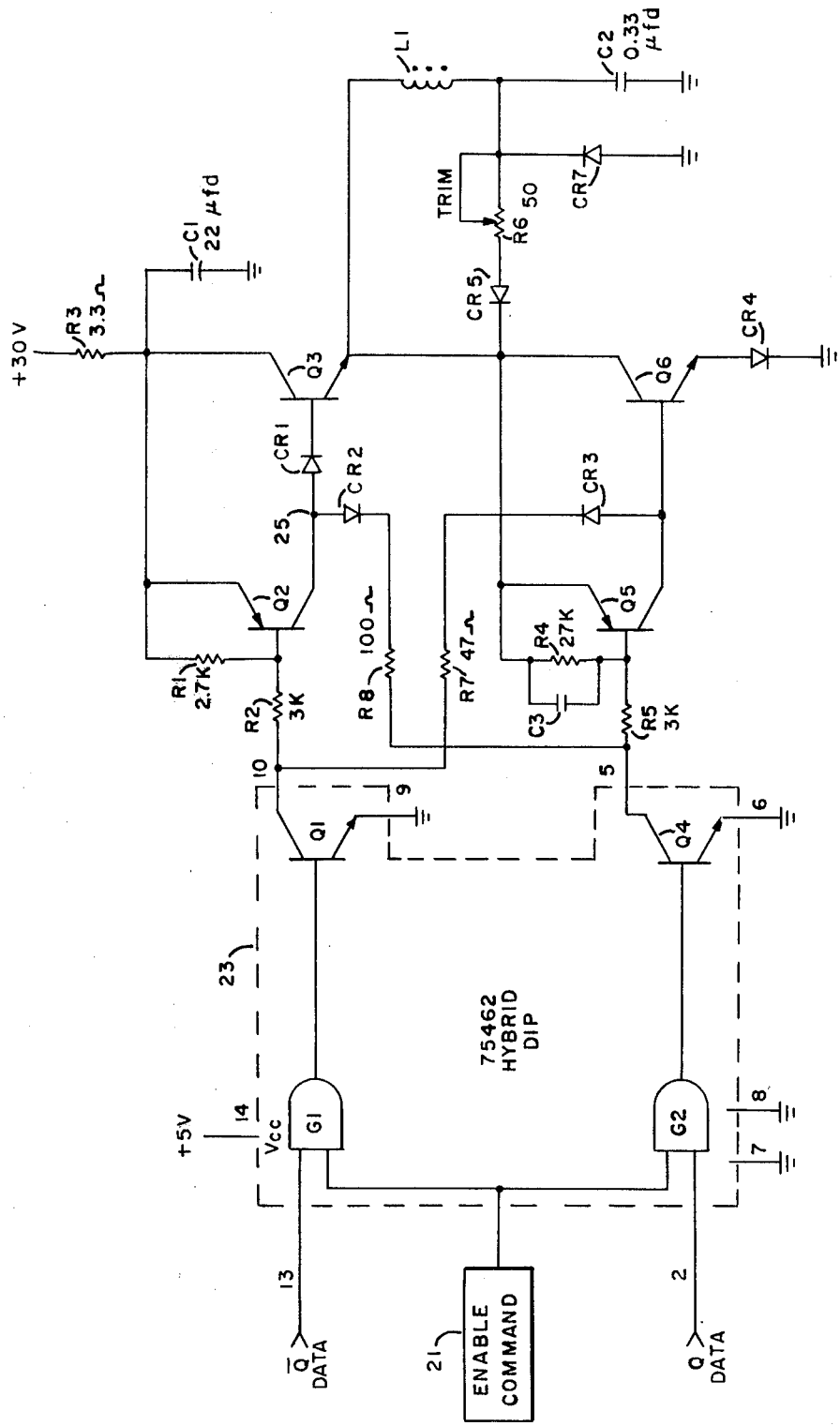
FIG. 1 is a schematic showing one preferred embodiment of the present invention.

In FIG. 1 when data input $\overline{Q}$ is high and when enable command 21 goes high the first time, AND gate G1 output goes high. This turns on the upper channel of Darlington Amplifier driver transistors Q1, Q2, and Q3. Since data input Q is low when $\overline{Q}$ is high, the lower Darlington driver channel Q4, Q5 and Q6 is turned off. With transistor Q3 turned on, capacitor C2 is charged through resistor R3, Q3 and the inductance coil L1. Coil L1 sets the state-of-the phase shifting ferrite for the transmit data mode of the radar system not shown. The current supplied from the +30VDC source through Q3 surges to a typical peak of 11 amperes in approximate 0.6 microsecond and reduces to zero as C2 becomes fully charged (see FIG. 2). However, the turn-on command to Q1 remains for 10 usec. This charges C2 to +30 v. which is held until the control logic toggles the data to make $\overline{Q}$ low and Q high. Then if the enable command 21 is high, AND gate G1 is off and AND gate G2 turns on; thus turning on the lower channel of Darlington Amplifier driver transistors Q4, Q5 and Q6. The turning on of Q6 discharges capacitor C2, partially through the ferrite coil L1 and partially through the trimpot R6. The amount of current diverted from the coil determines the amount of phase shift differential resulting, being related to the hysteresis loop of the ferrite of coil L1.

Resistors R1 and R2 provide the proper bias on transistor Q2 and provide a pull-down circuit for transistor Q1. Capacitor C1 is a filtering capacitor and current reservoir. Resistors R4 and R5 provide the same function as resistors R1 and R2 for transistors Q4 and Q5. The circuit as described so far would operate ideally if there where no crosstalk between the AND gates G1 and G2 in the 75462 hybrid dual-in-line package (DIP) 23.

It is thus seen that Q3 charges capacitor C2 and Q6 discharges it. Specifically, when Q3 is on Q6 should be off and vice versa. This condition was not satisfied in the circuit thus far described and before application of this invention, in that an undesired pulse of current of typically four amperes was also observed in Q3 during $\overline{Q}$ low time (see diagram of FIG. 2) in addition to the desired 11 ampere current pulse occurring at the $\overline{Q}$ high time period. Likewise, Q6 was observed to be conducting an undesired eight ampere current pulse at the $\overline{Q}$ high time period and a desired 8.4 ampere current pulse at $\overline{Q}$ low. Thus Q3 was having to dissipate over 1.5 times as much power as desired, and Q6 was having to dissipate almost twice as much power as anticipated. Keep in mind this undesirable condition will occur in most analog circuits driven by transistor-transistor logic circuits (TTL); therefore, giving broad application of the present invention.

The channel crosstalk was determined, by observation of currents and voltages throughout the entire circuit with an oscilloscope utilizing a current probe, to originate in the input gating and level changing circuits and to get progressively amplified in the ensuing stages.

Description After Application of Invention and Its Performance

One of the circuit modifications describing the basic elements of this invention consist of the addition of diodes CR2 and CR3. When used, they act to utilize the logic available from the collectors of transistors Q1 and Q4 to clamp the off-channel final driver base to near ground potential when the on-channel is being signalled. Diode CR2 (when lower channel is on) provides a ground path through Q4 for any currents generated at point 25; therefore clamping the base of Q3 to ground. Likewise diode CR3 (when the upper channel is on) clamps the base of Q6 to ground through Q1. This prevents the turning on of Q6 or Q3 at the wrong times. During their non-operating modes, the diodes are back biased with the voltage at the collector of Q1 or Q4 and are effectively not seen by the signalled channel.

Additional circuitry also part of this invention consists of the diodes CR1, CR4, and capacitor C3. CR1 acts to prevent emitter to base breakdown of Q3 when the drive signal to Q3 is off and the capacitor C2 charge exists on the emitter of Q3.

CR4 biases Q6 so as to prevent its response to the small residual crosstalk signal not completely eliminated by the action of CR3.

Capacitor C3 reduces the sensitivity of Q5 toward triggering from the crosstalk spikes coming into this channel.

Resistor R8 was added to reduce the current that Q4 must handle, since in the specific circuit used in this invention, Q4 was rated at 300 ma. R8's value is a compromise. Resistor R7 serves a similar purpose, but since the voltage at the base of Q6 is never high, as it is at the base of Q3, its significant advantage is to reduce a leading edge current spike on the output pulse of Q1.

Figure 2:
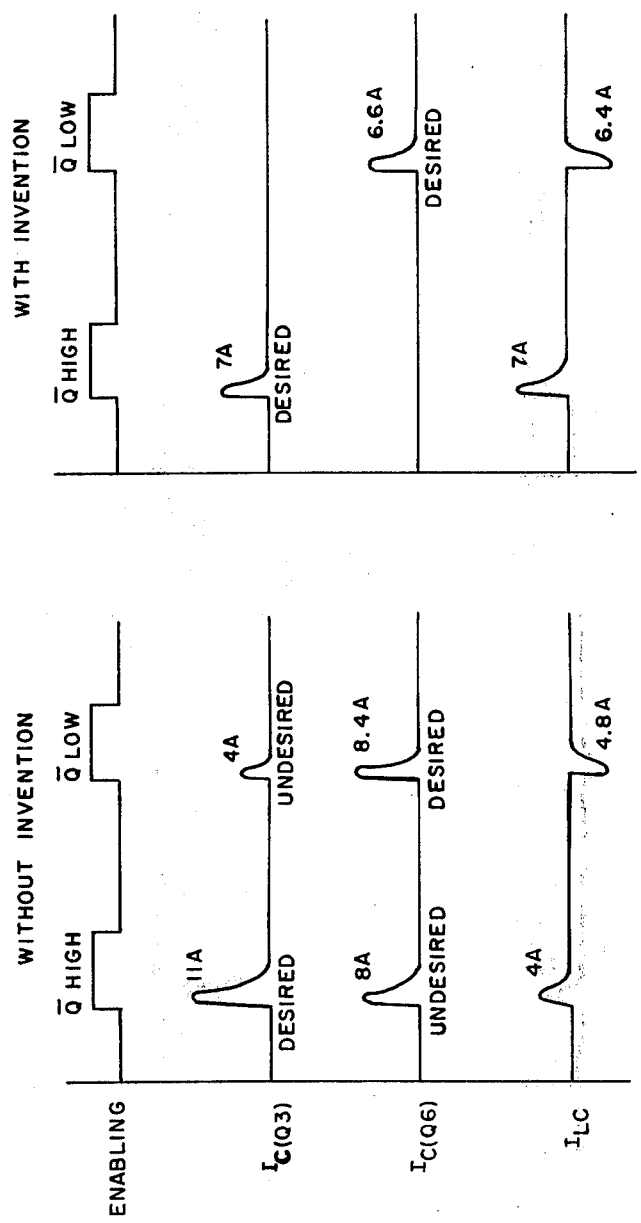
FIG. 2 is a graph showing the current pulses of particular elements of the present invention.

This invention cures a problem of channel crosstalk which originates in TTL saturated logic on a single substrate and is progressively amplified in the succeeding stages of the Darlington Amplifiers. A comparison of the original circuit performance with that after application of this invention is shown in FIG. 2 of this disclosure. Note the absence of the undesired current pulses for the circuit utilizing this invention.

Second Embodiment

Figure 3:
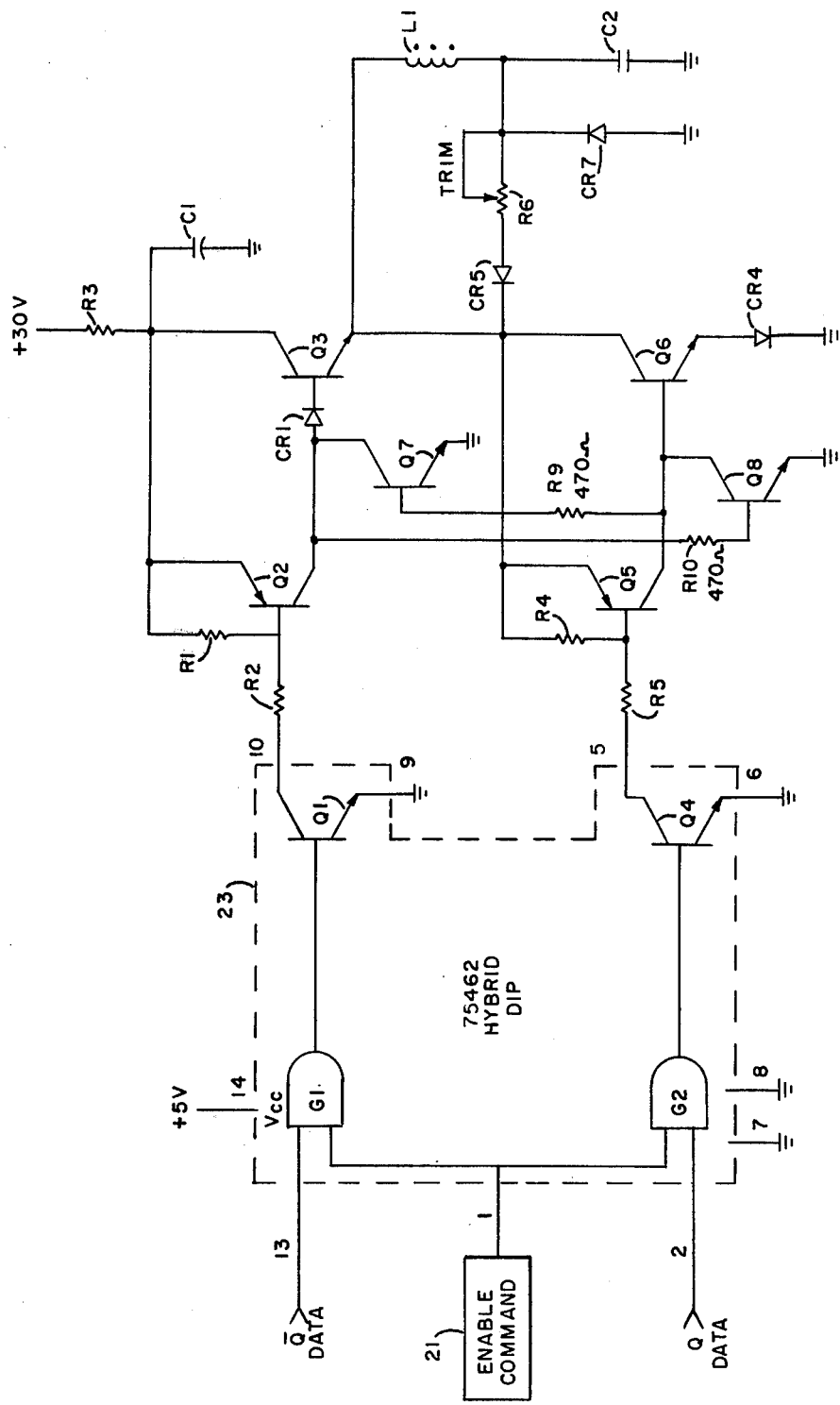
FIG. 3 is a schematic showing of a further embodiment illustrating the present invention.

The circuit modifications to the basic circuit (FIG. 1 without the additions described) consist of the addition of transistors Q7 and Q8 as shown in FIG. 3. When used, these two transistors utilize the logic available from the collectors of Q2 and Q5 to provide a clamp on the base inputs of Q3 and Q6 during the times at which crosstalk spikes occur. Resistors R9 and R10 limit the base drive of the clamping transistors Q7 and Q8. More specifically, when the Q1, Q2, Q3 channel is being signalled, the off-channel (Q4, Q5, Q6) is clamped off by Q8. Similarly, when the on-channel consists of Q4, Q5, and Q6, the off-channel (Q1, Q2, Q3) is clamped off by Q7. The clamps do not interfere with normal operation of a channel during the time period that it is being signalled to operate.

Diodes CR1 and CR4 are also used in FIG. 3 and perform the same functions as described in the disclosure of FIG. 1.

I claim:

1. In a system having first and second sequentially operated amplifier channels each having a channel input and a channel output, the improvement comprising first clamping means connected between the first channel and said second channel so that when said first channel is in an on condition said second channel is clamped to an off condition; second clamping means connected between said second channel and said first channel such that when said second channel is in an on condition said first channel is clamped to an off condition; said first and second amplifier channels consists of a plurality of cascaded connected amplifiers each having a signal input terminal and a current output path; the input terminal of one amplifier of each channel being connected to said channel input; a current path of another amplifier of each channel being connected to said channel output; said first clamping means being a first diode connected between a signal input terminal of an amplifier in said second channel and a current path of an amplifier in said first channel; and said second clamping means being a second diode connected between a signal input terminal of an amplifier in said first channel and a current path of an amplifier in said second channel.

2. A system as set forth in claim 1 further comprising a third diode connected in the current path of the amplifier in the second channel whose input terminal has said first diode connected thereto; and a fourth diode connected between said second diode and said input terminal of the amplifier in the first channel whose input terminal is connected to said second diode.

3. In a system having first and second sequentially operated amplifier channels each having a channel input and a channel output, the improvement comprising first clamping means connected to said first channel, said second channel and ground so that when said first channel is in an on condition said second channel is clamped to an off condition; second clamping means connected to said second channel, said first channel and ground such that when said second channel is in an on condition said first channel is clamped to an off condition; each channel has a plurality of cascaded connected amplifiers each having a signal input terminal and a current path; the input terminal of one amplifier of each channel being connected to said channel input; a current path of another amplifier of each channel being connected to said channel output; said first clamping means being a first transistor having a current path and a base terminal; the base terminal of said first transistor being connected to the current path of one of the amplifiers of said first channel; said current path of said first transistor being connected between one input terminal of an amplifier in said second channel and ground so as to clamp said second channel when said first transistor is in an on condition; said second clamping means being a second transistor having a current path and a base terminal; said base terminal of said second transistor being connected to the current path of one of the amplifiers of said second channel; and said second transistor having its current path connected between the input terminal of one of the amplifiers of said first channel and ground so as to clamp it when said second transistor is in an on condition.

4. A system as set forth in claim 3 further comprising a first diode connected to the current path of the amplifier having its input terminal connected to said first transistor; and a second diode connected between the input terminal of an amplifier in said first channel and the current path of said second transistor.

* * * * *